(12) United States Patent
Kosugi et al.

(10) Patent No.: US 6,496,245 B2
(45) Date of Patent: Dec. 17, 2002

(54) DEVELOPING METHOD AND DEVELOPING APPARATUS

(75) Inventors: Hitoshi Kosugi, Kumamoto (JP); Hideharu Kyouda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/839,293

(22) Filed: Apr. 23, 2001

(65) Prior Publication Data

US 2002/0008857 A1 Jan. 24, 2002

(30) Foreign Application Priority Data

Apr. 25, 2000 (JP) .................................. 2000-123857

(51) Int. Cl.[7] .................. G03B 27/32; B05C 11/02; B41J 2/01; G03D 5/00; G03C 5/00
(52) U.S. Cl. .................. 355/27; 355/77; 355/72; 118/52; 118/56; 347/101; 347/104; 396/604; 396/611; 430/311; 430/314; 430/322; 430/935
(58) Field of Search .................. 355/27, 72, 77; 347/101, 104; 430/311, 314, 322, 935; 118/52, 56; 396/604, 611

(56) References Cited

U.S. PATENT DOCUMENTS 6,033,475 A * 4/2000 Hasebe et al.
6,051,349 A * 4/2000 Yoshioka et al.
6,306,455 B1 * 10/2001 Takamori et al.
6,319,317 B1 * 11/2001 Takamori

* cited by examiner

*Primary Examiner*—Russell Adams
*Assistant Examiner*—Khaled Brown
(74) *Attorney, Agent, or Firm*—Oblon, Spivak, McClelland, Maier & Neustadt, P.C.

(57) ABSTRACT

The present invention is a method of supplying a developing solution to an entire face of a substrate to perform a developing treatment, including the steps of: moving a developing solution supply nozzle at a predetermined speed at least from one end to another end of the substrate while the developing solution is being supplied; measuring an amplitude of a wave on a solution face of the developing solution supplied on the substrate after the supply of the developing solution; and changing the predetermined speed of the developing solution supply nozzle based on a measured value. Accordingly, it is unnecessary to measure a line width or the like which is finally formed on the substrate before correction as in the conventional art, and thus the correction can be made earlier as compared with the conventional case, resulting in a reduced number of defective items and improved yield.

13 Claims, 9 Drawing Sheets

| SOLUTION THICKNESS (mm) | SUPPLY FLOW RATE (l/min) CORRESPONDING TO EACH MOVING SPEED (mm/s) OF DEVELOPING SOLUTION SUPPLY NOZZLE | | | | | | | |
|---|---|---|---|---|---|---|---|---|
| | 50 (mm/s) | 60 | 70 | 80 | 90 | 100 | 110 | 120 |
| 1.4 | 0.8 | 1.0 | 1.2 | 1.4 | 1.5 | 1.7 | 1.8 | 2.0 |
| 1.6 | 1.0 | 1.2 | 1.4 | 1.5 | 1.7 | 1.9 | 2.1 | 2.3 |
| 1.8 | 1.1 | 1.3 | 1.5 | 1.7 | 1.9 | 2.1 | 2.4 | 2.5 |
| 2.0 | 1.2 | 1.4 | 1.7 | 2.0 | 2.2 | 2.4 | 2.6 | 2.9 |

DEVELOPING METHOD AND DEVELOPING APPARATUS

BACKGROUND OF THE INVENTION

1. Field of the Invention

The present invention relates to a developing method and a developing apparatus for a substrate.

2. Description of the Related Art

In a photolithography process in the semiconductor device fabrication processes, for example, a resist coating treatment in which a resist solution is applied to the front of a wafer to form a resist film thereon, exposure processing in which the wafer is exposed in a pattern, a developing treatment in which development is performed for the exposed wafer, and the like are performed in sequence to form a predetermined circuit pattern on the wafer.

In the above-described developing treatment, a so-called scan method has been conventionally employed in which a developing solution supply nozzle which is formed longer than a diameter of the wafer and has a plurality of supply ports along its longitudinal direction moves at a predetermined speed from one end to the other end of the wafer while supplying the developing solution at a predetermined flow rate, thereby supplying the developing solution to the entire face of the wafer to perform the developing treatment for the wafer.

When the above-described scan method is used, it is preferable to increase the moving speed of the developing solution supply nozzle and the supply flow rate of the developing solution as much as possible in the viewpoint of matching as much as possible start times of development within the face of the wafer. However, when the moving speed of the developing solution supply nozzle or the like is too high, a so-called waviness phenomenon occurs in which waves appear on the developing solution supplied on the substrate. It is known that if the waviness phenomenon occurs, development is not properly performed, finally causing adverse effects upon the form of the pattern. Therefore, it is necessary to tightly fine-adjust and set the moving speed or the like of the developing solution supply nozzle to an adequate speed.

When the recipe for the wafer is changed and so on, an operator corrects the moving speed or the supply flow rate by measuring the line width or the like which is finally formed on the wafer, predicting more suitable conditions from the measured value based on his experience and the like, and changing the moving speed or the like by hand each time.

However, the corrections of the moving speed and the like of the developing solution supply nozzle which are performed by the measurement of the finally formed line width or the like on the wafer and by hand of the operator as described above requires a considerably long time before the moving speed is changed to an adequate speed, causing harmful effects of, for example, fabricating many wafers of poor quality during the above time.

SUMMARY OF THE INVENTION

The present invention is made in the above viewpoints, and its object is to provide a developing method capable of making corrections earlier for an adequate supply condition of a developing solution to prevent occurrence of excessive waves on a solution face of the developing solution while matching as much as possible periods of development within the face of the substrate, and a developing apparatus capable of carrying out the developing method.

To attain the object, the developing method of the present invention is a method of supplying a developing solution to an entire face of a substrate to perform a developing treatment, comprising the steps of: moving a developing solution supply nozzle at a predetermined speed at least from one end to another end of the substrate while the developing solution is being supplied; measuring an amplitude of a wave on a solution face of the developing solution supplied on the substrate after the supply of the developing solution; and changing the predetermined speed of the developing solution supply nozzle based on a measured value. It should be noted that "after the supply of the developing solution" means "after the developing solution is supplied onto the substrate," but it is more preferable to perform the aforesaid step immediately after the supply. Further, changing the predetermined speed means changing the setting of the predetermined speed to change the predetermined speed when the developing solution is supplied to a substrate which will be subjected to a developing treatment next.

According to another aspect of the present invention, the developing method of the present invention is a method of supplying a developing solution to an entire face of a substrate to perform a developing treatment, comprising the steps of: moving a developing solution supply nozzle at a predetermined speed at least from one end to another end of the substrate while the developing solution is being supplied; measuring an amplitude of a wave on a solution face of the developing solution supplied on the substrate after the supply of the developing solution; and changing a predetermined flow rate of the developing solution from the developing solution supply nozzle based on a measured value. Changing the predetermined flow rate means changing the setting of the predetermined flow rate to change the predetermined flow rate when the developing solution is supplied to the substrate which will be subjected to a developing treatment next.

According to still another aspect of the present invention, the developing method of the present invention is a method of supplying a developing solution to an entire face of a substrate to perform a developing treatment, comprising the step of: moving a developing solution supply nozzle at a predetermined speed at least from one end to another end of the substrate while the developing solution is being supplied, wherein the moving speed is increased or a supply amount from the developing solution supply nozzle is decreased when the developing solution immediately after being supplied flows ahead in a moving direction of the developing solution supply nozzle during the move.

According to yet another aspect of the present invention, the developing method of the present invention is a method of supplying a developing solution to an entire face of a substrate to perform a developing treatment, comprising the step of: moving a developing solution supply nozzle at a predetermined speed at least from one end to another end of the substrate while the developing solution is being supplied, wherein the moving speed is decreased or a supply amount from the developing solution supply nozzle is increased when the supplied developing solution is thinner, at a rear position with respect to a moving direction of the developing solution supply nozzle, than a part thereof which has been previously supplied during the move.

The developing apparatus of the present invention is a developing apparatus for supplying a developing solution to an entire face of a substrate to perform a developing treatment, comprising: a developing solution supply nozzle for supplying the developing solution to the substrate while moving at a predetermined speed at least from one end to another end of the substrate; an amplitude measuring device for measuring an amplitude of a wave on a solution face of the developing solution supplied on the substrate; and a moving speed controller for controlling the predetermined speed of the developing solution supply nozzle based on a value measured by the amplitude measuring device.

According to another aspect of the present invention, the developing apparatus of the present invention is a developing apparatus for supplying a developing solution to an entire face of a substrate to perform a developing treatment, comprising: a developing solution supply nozzle for supplying the developing solution to the substrate while moving at a predetermined speed at least from one end to another end of the substrate; an amplitude measuring device for measuring an amplitude of a wave on a solution face of the developing solution supplied on the substrate; and a flow rate controller for controlling a predetermined flow rate of the developing solution from the developing solution supply nozzle based on a value measured by the amplitude measuring device.

According to still another aspect of the present invention, the developing apparatus of the present invention is a developing apparatus for supplying a developing solution to an entire face of a substrate to perform a developing treatment, comprising: a developing solution supply nozzle for supplying the developing solution to the substrate while moving at a predetermined speed at least from one end to another end of the substrate; an amplitude measuring device for measuring an amplitude of a wave on a solution face of the developing solution supplied on the substrate; and a controller for controlling a predetermined flow rate of the developing solution from the developing solution supply nozzle and the predetermined speed of the developing solution supply nozzle based on a value measured by the amplitude measuring device.

According to the present invention, the amplitude of the wave occurring on the solution face of the developing solution supplied onto the substrate is measured, and the predetermined speed of the developing solution supply nozzle is changed based on the measured value. Thus, it is unnecessary to measure the line width or the like which is finally formed on the substrate and then correct the predetermined speed based on the measured value as in the conventional art. Therefore, it is possible to supply the developing solution at the predetermined speed adequate, for example, for the substrate which will be subjected to a developing treatment next, with the result that the predetermined speed can be corrected to the adequate predetermined speed earlier. Further, the amplitude of the wave of the developing solution is measured, and the predetermined speed or the predetermined flow rate of the developing solution supply nozzle is changed based on the measured value. This makes it possible to decrease, for example, the predetermined speed adequately or to decrease the supply amount when the amplitude of the wave is large so as to decrease the amplitude the wave, or to increase the predetermined speed adequately or to increase the supply amount when the amplitude of the wave is small so as to match the periods of development within the face of the substrate.

DETAILED DESCRIPTION OF THE PREFERRED EMBODIMENT

Figure 1:
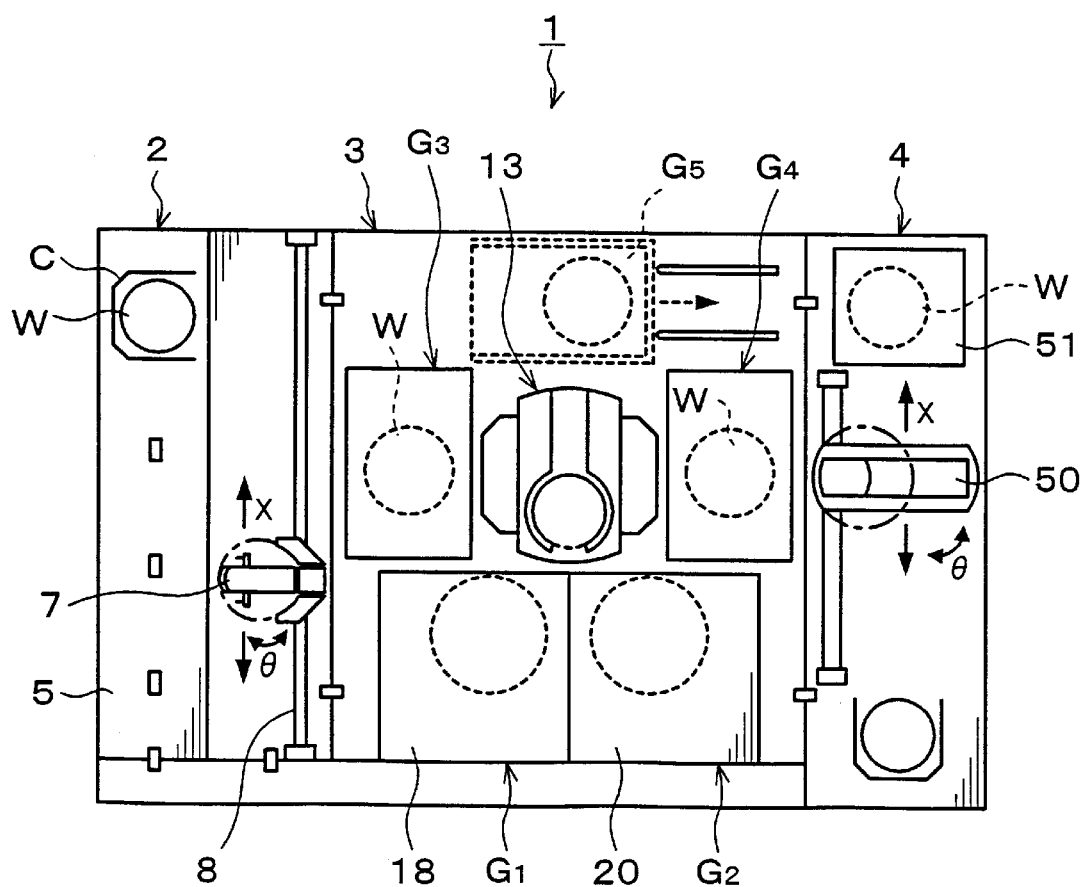
FIG. 1 is a plan view showing an appearance of a coating and developing system including a developing unit used in a developing method according to an embodiment.
Figure 2:
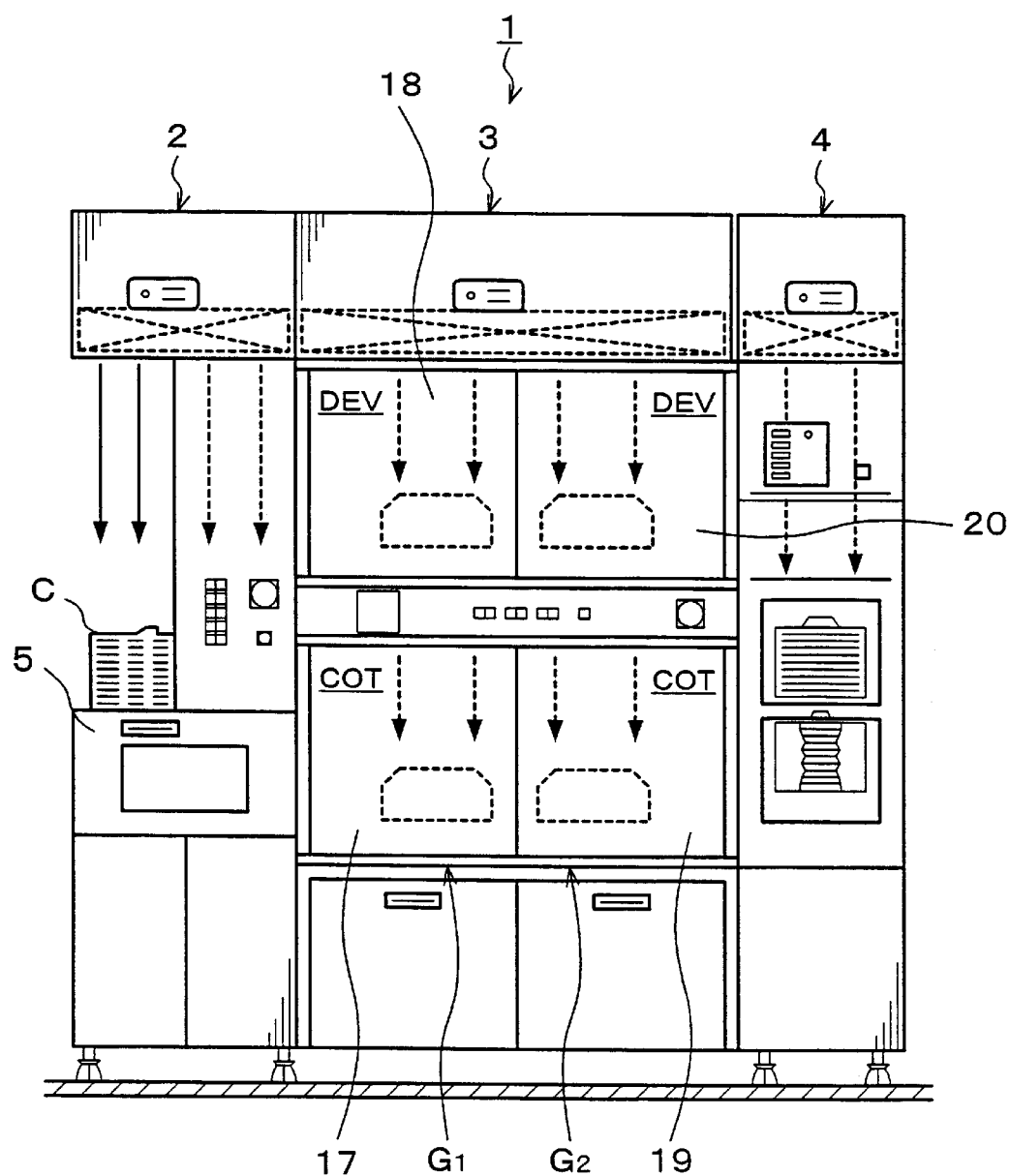
FIG. 2 is a front view of the coating and developing system in FIG. 1.
Figure 3:
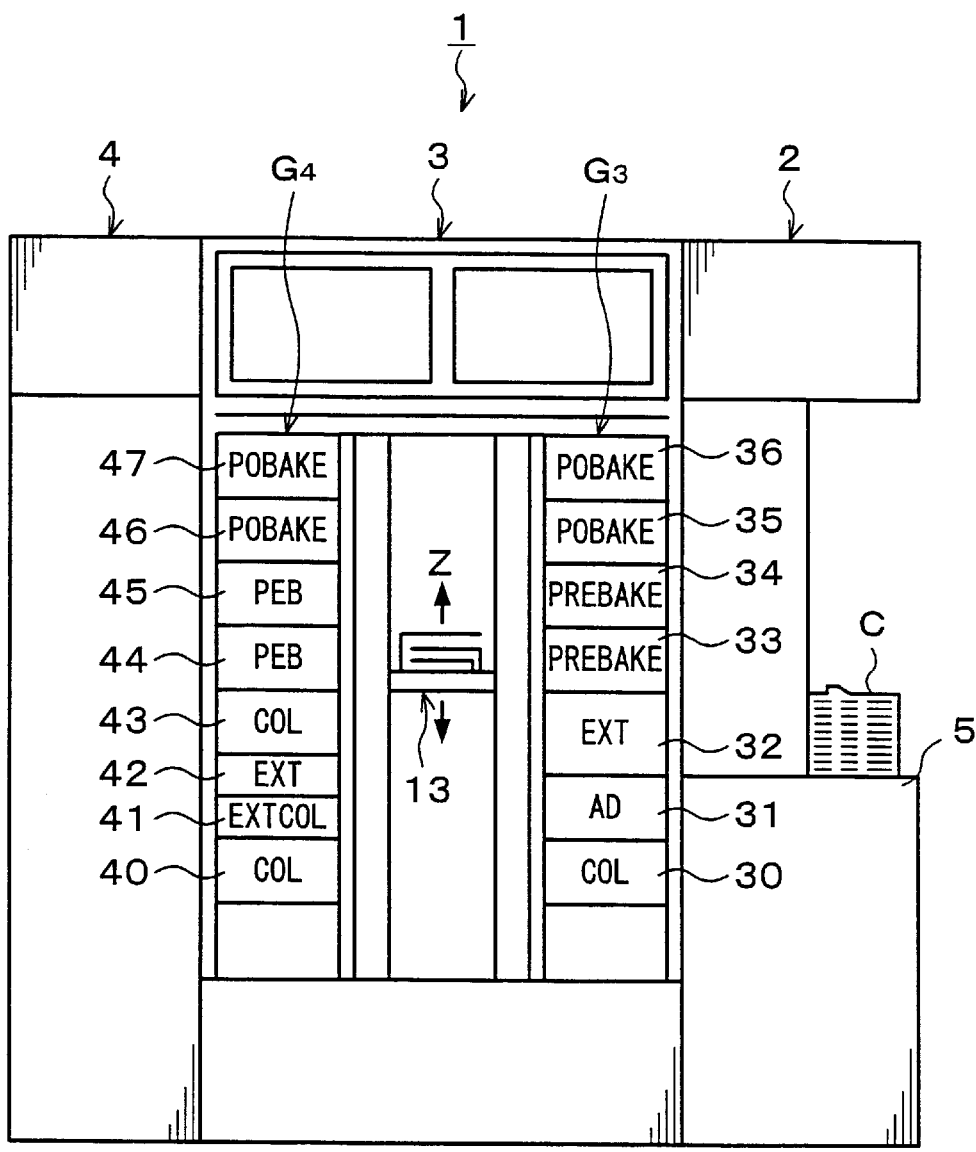
FIG. 3 is a rear view of the coating and developing system in FIG. 1.

Hereinafter, a preferred embodiment of the present invention will be explained to thereby describe the present invention in detail. A developing method according to this embodiment is carried out by a developing apparatus. FIG. 1 is a plan view of a coating and developing system 1 including the developing unit, FIG. 2 is a front view of the coating and developing system 1, and FIG. 3 is a rear view of the coating and developing system 1.

The coating and developing system 1 has a configuration, as shown in FIG. 1, in which a cassette station 2 for carrying, for example, 25 wafers W in a cassette, as a unit, from/to the outside into/out of the coating and developing system 1 and carrying the wafer W into/out of a cassette C, a processing station 3 in which various kinds of processing and treatment units each for performing predetermined processing or treatment for the wafers W one by one in coating and developing steps are multi-tiered, and an interface section 4 for delivering the wafer W to/from an aligner, not shown, provided adjacent to the processing station 3 are integrally connected.

In the cassette station 2, a plurality of cassettes C can be mounted at predetermined positions on a cassette mounting table 5 which is a mounting portion in a line in an X-direction (a vertical direction in FIG. 1). A wafer carrier 7 transportable in the direction of arrangement of the cassettes (the X-direction) and in the direction of arrangement of the wafers W housed in the cassette C (a Z-direction; a vertical direction) is provided to be movable along a carrier guide 8 so as to selectively get access to each cassette C.

The wafer carrier 7 has an alignment function of aligning the wafer W. The wafer carrier 7 is configured to get access also to an extension unit 32 included in a third processing unit group G3 on the processing station 3 side as described later.

In the processing station 3, a main carrier unit 13 is provided at the center thereof, and various kinds of processing and treatment units are multi-tiered around the main carrier unit 13 to form processing unit groups. In the coating and developing system 1, four processing unit groups G1, G2, G3, and G4 are arranged, the first and second processing unit groups G1 and G2 are disposed on the front side thereof, the third processing unit group G3 is disposed adjacent to the cassette station 2, and the fourth processing unit group G4 is disposed adjacent to the interface section 4. Further, a fifth processing unit group G5 shown by a broken line can be additionally disposed on the rear side as an option. The main carrier unit 13 can carry in/out the wafer W to/from the various kinds of processing and treatment units described later arranged in the processing unit groups G1, G3, G4 and G5.

In the first processing unit group G1, for example, as shown in FIG. 2, a resist coating unit 17 for applying a resist solution to the wafer W and a developing unit 18 in which the developing method according to this embodiment is carried out are two-tiered in order from the bottom. In the second processing unit group G2, a resist coating unit 19 and a developing unit 20 are similarly two-tiered in order from the bottom.

In the third processing unit group G3, for example, as shown in FIG. 3, a cooling unit 30 for cooling the wafer W, an adhesion unit 31 for enhancing fixedness between the resist solution and the wafer W, an extension unit 32 for allowing the wafer to wait therein, pre-baking units 33 and 34 each for evaporating a solvent in the resist solution, post-baking units 35 and 36 each for performing a heat treatment after the developing treatment, and the like are, for example, seven-tiered in order from the bottom.

In the fourth processing unit group G4, for example, a cooling unit 40, an extension and cooling unit 41 for allowing the wafer W mounted thereon to cool by itself, an extension unit 42, a cooling unit 43, post-exposure baking units 44 and 45 each for performing a heat treatment after exposure processing, post-baking units 46 and 47, and the like are, for example, eight-tiered in order from the bottom.

A wafer carrier 50 is provided at the center of the interface section 4. The wafer carrier 50 is configured to be movable in the X-direction (the vertical direction in FIG. 1) and in the Z-direction (the vertical direction) and rotatable in a θ-direction (a direction of rotation around a Z-axis) so as to carry the wafer W to each of the extension and cooling unit 41 and the extension unit 42 included in the fourth processing unit group G4, a peripheral aligner 51, and the not shown aligner.

Figure 4:
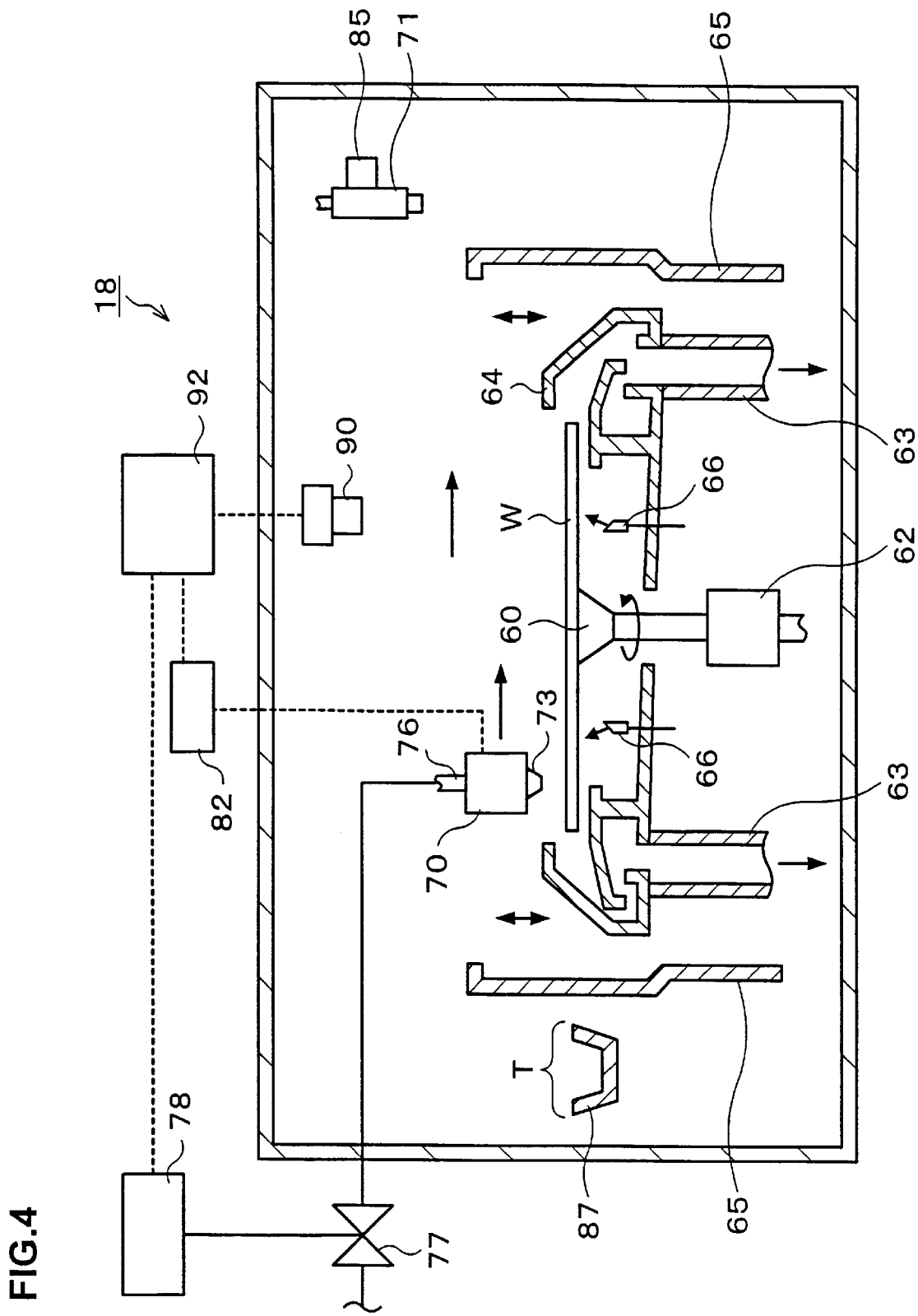
FIG. 4 is an explanatory view of a vertical cross section of the developing unit in the embodiment.
Figure 5:
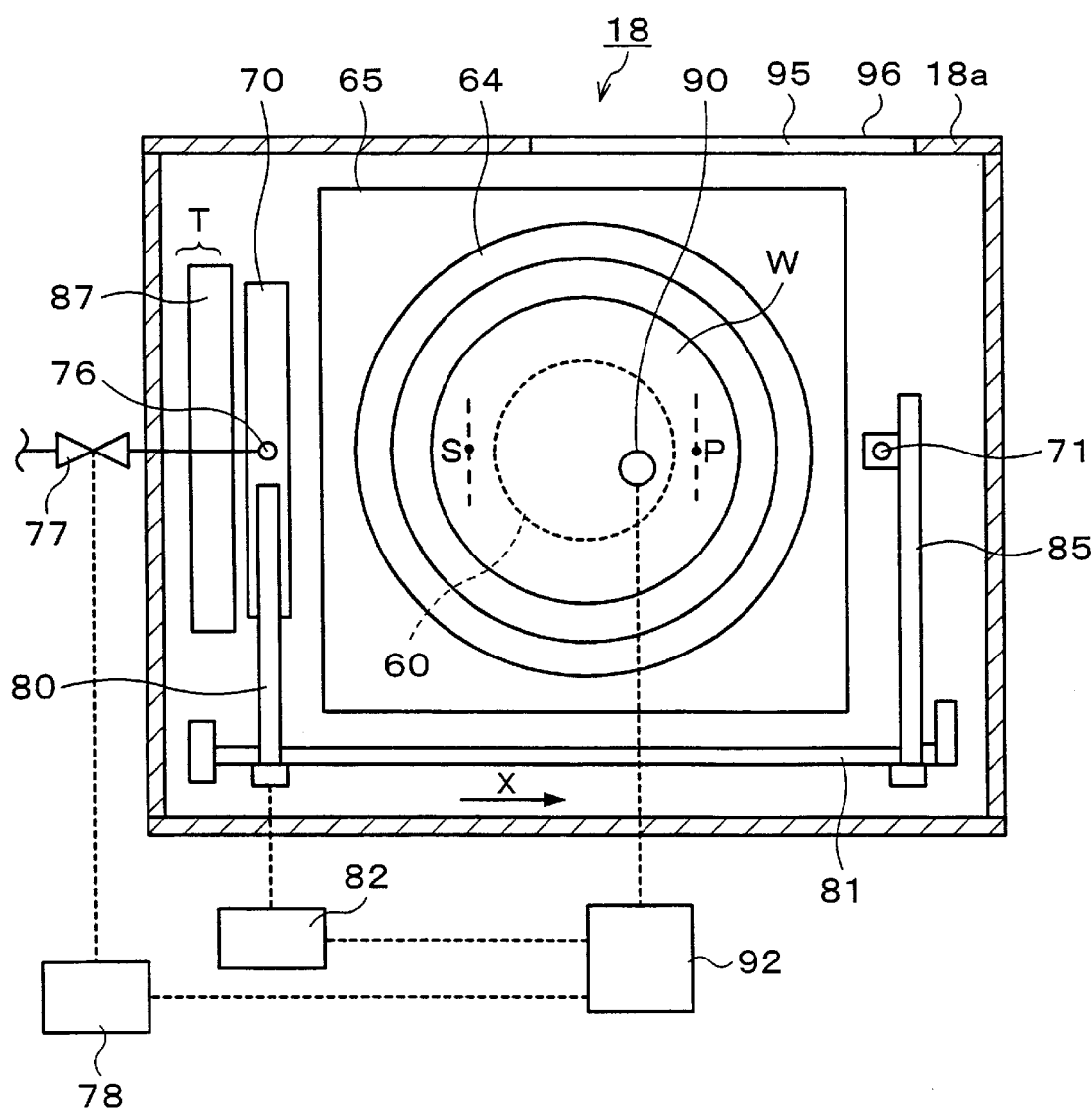
FIG. 5 is an explanatory view of a horizontal cross section of the developing unit used in the embodiment.

Next, the configuration of the aforementioned developing unit 18 will be explained in detail. As shown in FIGS. 4 and 5, a spin chuck 60 for sucking and holding the wafer W is provided in a casing 18a of the developing unit 18. A rotary drive mechanism 62 having, for example, a motor and the like, for rotating the spin chuck 60 at a predetermined speed is provided below the spin chuck 60. The rotary drive mechanism 62 of the spin chuck 60, having a function of freely moving the spin chuck 60 up and down, moves the spin chuck 60 up and down when the wafer W is carried in/out to allow the spin chuck 60 to deliver/receive the wafer W to/from the main carrier unit 13.

An annular cup 64 with an upper face opened is provided outside the outer periphery of the spin chuck 60 to surround the outer periphery so as to receive the developing solution and the like splashing from the wafer W which is suction-held on the spin chuck 60 and rotated, thereby preventing the units therearound from being contaminated. A drain pipe 63 for draining the developing solution and the like splashing from the wafer W and the like is provided at the bottom of the cup 64. Further, rear face washing nozzles 66 are provided in the cup 64, which supply a washing solution to the rear face of the wafer W which is held on the spin chuck 60 to thereby wash the rear face of the wafer W. Incidentally, a not shown drive mechanism is provided to move the entire cup 64 up and down.

An outer cup 65 in a square form with an upper face opened is provided further outside the cup 64 to surround the cup 64 to receive the developing solution and the like from the wafer W and a developing solution supply nozzle 70 described later, which can not be received by the aforesaid cup 64. Incidentally, the outer cup 65 is provided with a not shown drive mechanism which freely moves the outer cup 65 up and down so as to move up, for example, when the wafer W is washed to collect the splashing washing solution and the like more completely.

Above the spin chuck 60 and the cup 64, the developing solution supply nozzle 70 as a developing solution supply nozzle for supplying the developing solution to the wafer W, and a washing nozzle 71 for supplying the washing solution to the upper face of the wafer W are provided to be movable in the lateral direction (the X-direction in FIGS. 4 and 5) and in the vertical direction.

Figure 6:
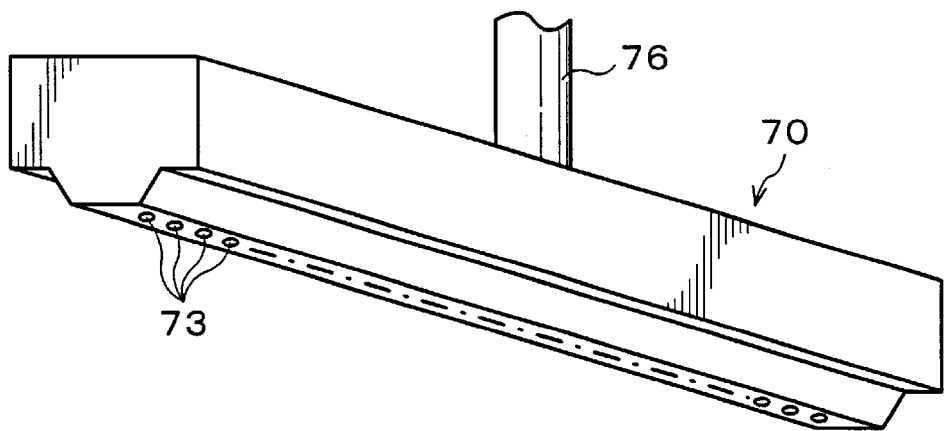
FIG. 6 is a perspective view of a developing solution supply nozzle used in the developing unit in FIG. 4.
Figure 7:
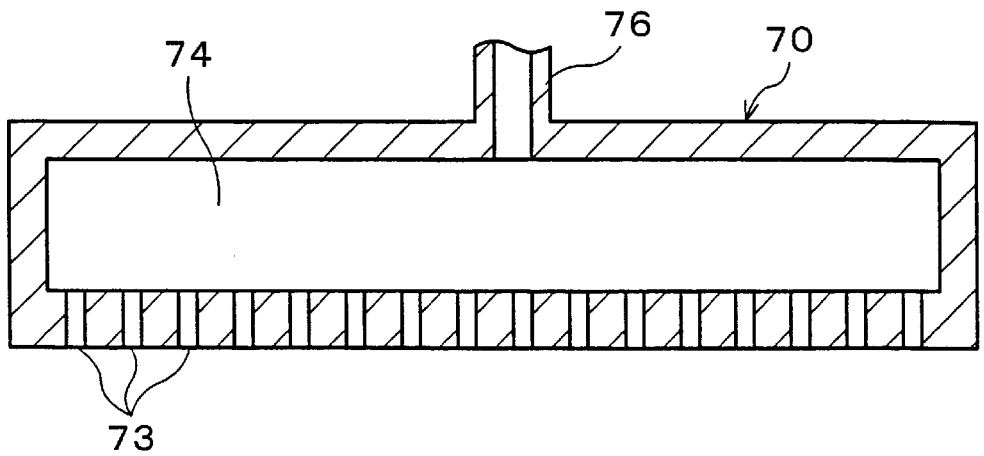
FIG. 7 is a vertical sectional view of the developing solution supply nozzle in FIG. 6

The developing solution supply nozzle 70, as shown in FIG. 5 and FIG. 6, has an elongated form, and its length is at least larger than a diameter of the wafer W. The lower portion of the developing solution supply nozzle 70 is provided with a plurality of developing solution supply ports 73 in a line in the longitudinal direction thereof. Further, as shown in FIG. 7, a space 74 is formed in the developing solution supply nozzle 70, which is long in the longitudinal direction and communicates with the developing solution supply ports 73 and temporarily stores therein the developing solution flowing into the developing solution supply nozzle 70 to discharge the developing solution therefrom through the developing solution supply ports 73 at the same time and at the same flow rate.

One end of a piping 76 for allowing the developing solution from a not shown developing solution supply source into the developing solution supply nozzle 70 is connected to the top of the developing solution supply nozzle 70. A valve 77 is provided along the piping 76 to check the flow rate of the developing solution discharged from the developing solution supply nozzle 70. Incidentally, the degree of the opening and closing of the valve 77 is controlled by a flow rate controller 78.

The developing solution supply nozzle 70, as shown in FIG. 5, is held in such a manner to be hung from an arm 80. The arm 80 is configured to be movable on a rail 81 which extends in one direction (the X-direction in FIG. 5) in the casing 18a, and its moving speed and moving timing are controlled by a movement controller 82. Accordingly, the developing solution supply nozzle 70 discharges the developing solution at a predetermined flow rate while moving above and parallel to the wafer W at a predetermined speed to supply the developing solution to the entire face of the wafer W to thereby form a solution film of the developing solution with a predetermined film thickness on the wafer W. The aforesaid arm 80 has a structure including a cylinder and the like so as to move in the vertical direction to adjust the distance between the developing solution supply nozzle 70 and the wafer W.

On the other hand, the washing nozzle 71 is supported by an arm 85 which is configured to be freely movable on the rail 81 by a not shown drive mechanism. Accordingly, the washing nozzle 71 is movable in the X-direction similarly to the developing solution supply nozzle 70. It should be noted that when the arm 85 is located above the center of the wafer W, the washing nozzle 71 is located to be able to supply the washing solution to the center of the wafer W. With this arrangement, the washing solution supplied onto the wafer W which is being rotated is diffused over the entire face of the wafer W to wash the entire face of the wafer W without unevenness.

Further, as shown in FIG. 4 and FIG. 5, a washing bath 87 for washing the developing solution supply nozzle 70 is provided at a waiting position T of the developing solution supply nozzle 70 which is located outside the outer cup 65. The washing bath 87 is formed to have a cross section in a recessed form to catch the elongated developing solution supply nozzle 70. The washing bath 87 stores therein a predetermined solvent for washing the developing solution adhering to the developing solution supply nozzle 70.

Above the spin chuck 60, for example, a laser displacement gauge 90 is fixedly provided as an amplitude measuring device which can measure the displacement of an object to be measured by measuring the distance therefrom to the object to be measured using laser light. More specifically, the laser displacement gauge 90 is configured to apply laser light to the developing solution supplied on the wafer W, which is the object to be measured, and receive its reflected light to thereby measure the amplitude of a wave occurring on a solution face E of the developing solution.

Figures 8, 9:
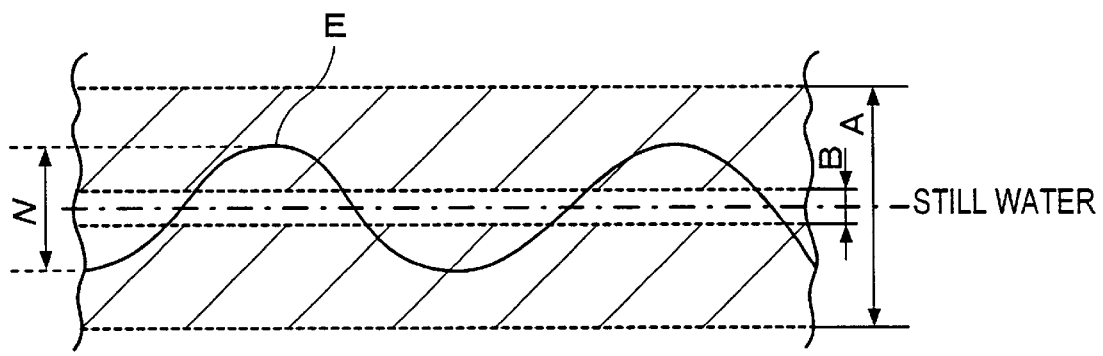
FIG. 8 is an explanatory view showing a tolerable range of an amplitude of a wave on a solution face of a developing solution supplied on a wafer.
FIG. 9 is a table showing recipes of setting conditions of the developing solution supply nozzle.

The measured value which is measured by the laser displacement gauge 90 is sent to a main controller 92 having a function as a controlling means. The main controller 92 stores a tolerable range (a diagonally shaded part in FIG. 8) of an amplitude of the wave on the solution face E as shown in FIG. 8 which has been previously obtained, for example, by an experiment or the like, and recipes of the moving speed of the developing solution supply nozzle 70 and the supply flow rate of the developing solution with respect to each target solution film thickness of the developing solution supplied onto the wafer W as shown in FIG. 9. Incidentally, FIG. 8 is an explanatory view schematically showing the state of the waves as seen from the side of the wafer W. "Film thickness" in FIG. 9 represents the thickness of the solution film of the developing solution supplied on the wafer W. The main controller 92 compares a measured value N and an upper limit tolerable value A or a lower limit tolerable value B of the aforesaid tolerable range. When the measured value N deviates from the tolerable range, the main controller 92 can send the data according to the recipe to the movement controller 82 which controls the moving speed of the developing solution supply nozzle 70 and to the flow rate controller 78 which controls the supply flow rate of the developing solution, so that the set values of the moving speed and the supply flow rate are changed by the data.

It should be noted that the casing 18a is provided with a carrier opening 95 for allowing the wafer W to be carried in/out by the main carrier unit 13 and a shutter 96 for opening/closing the carrier opening 95. Except when the wafer W is carried in/out, the shutter 96 is closed to prevent the treatment solution from splashing from within the casing 18a and the like and maintain a predetermined atmosphere therein.

The developing method which is carried out in the developing unit 18 structured as described above will be explained next with the photolithography process which is performed in the coating and developing system 1.

First, the wafer carrier 7 takes one unprocessed wafer W out of the cassette C and carries it into the adhesion unit 31 included in the third processing unit group G3. The wafer W coated in the adhesion unit 31 with an adhesion promoter such as HMDS which enhances the adhesion to the resist solution is carried by the main carrier unit 13 to the cooling unit 30 and cooled to a predetermined temperature. Thereafter, the wafer W is carried to the resist coating unit 17 or 19 and to the pre-baking unit 34 or 35 in sequence to be subjected to predetermined processing. Thereafter, the wafer W is carried to the extension and cooling unit 41.

Subsequently, the wafer W is taken out of the extension and cooling unit 41 by the wafer carrier 50, and then carried through the peripheral aligner 51 to the aligner (not shown). The wafer W for which exposure processing has been completed is carried by the wafer carrier 50 to the extension unit 42 and then held by the main carrier unit 13. Then, the wafer W is carried to the post-exposure baking unit 44 or 45 and to the cooling unit 43 in sequence, where the wafer W is subjected to predetermined processing, and thereafter it is carried to the developing unit 18 or 20.

Explaining in detail processes of the above-described developing treatment, the wafer W for which previous processing has been completed is first carried into the developing unit 18 by the main carrier unit 13 and suction-held on the spin chuck 60. Then, the developing solution supply nozzle 70 which has been waiting in the washing bath 87 located at the waiting position T moves to a position S which is in the cup 64 and outside one end of the wafer W.

At the position S, the developing solution supply nozzle 70 starts the discharge of the developing solution, and continues the trial discharge until the discharge state becomes stable. When, for example, a target film thickness of 1.6 mm and a moving speed of the developing solution supply nozzle 70 of 80 mm/s are chosen from FIG. 9, the supply flow rate of the developing solution in this event is 1.5 l/min.

Thereafter, the developing solution supply nozzle 70 moves at the predetermined speed of 80 mm/s from the position S outside the one end of the wafer W to a position P which is located outside the other end thereof, thereby forming a solution film of the developing solution on the wafer W. Processes of correcting the moving speed of the developing solution supply nozzle 70 will be explained here using FIG. 10.

Immediately after the developing solution supply nozzle 70 reaches the position P which is outside the other end of the wafer W to thereby form the solution film of the developing solution on the wafer W, the laser displacement gauge 90 starts measurement to measure the amplitude of the waves on the solution face E of the solution film on the wafer W. Then the measured value N is sent to the main controller 92 and compared with the aforesaid tolerable range of the amplitude which has been previously stored in the main controller 92.

Figure 10:
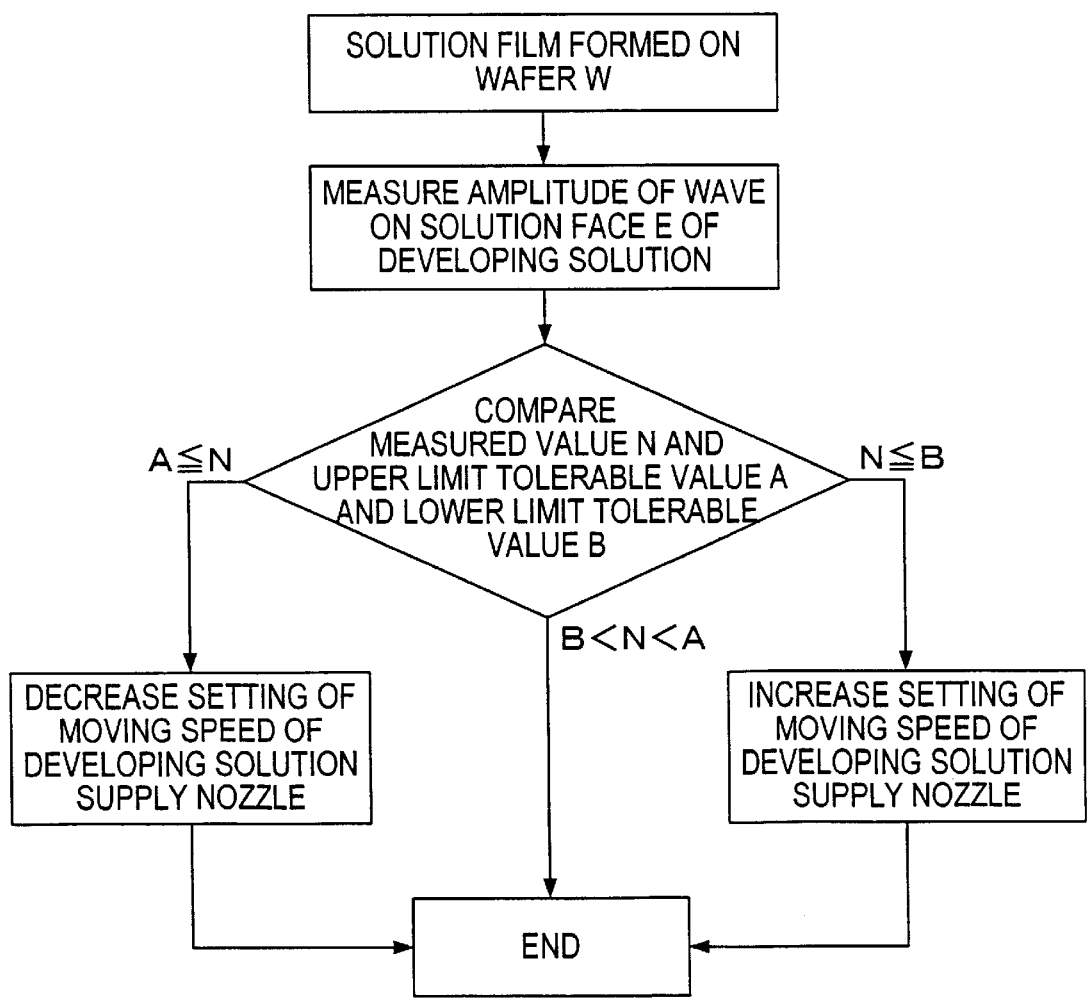
FIG. 10 is a flowchart when the setting conditions of the developing solution supply nozzle are corrected.

When the measured value N is greater than the upper limit tolerable value A of the tolerable range, for example, a moving speed of 70 mm/s which is one level lower speed of the moving speed of the developing solution supply nozzle 70 is read according to the recipe shown in FIG. 9 and FIG. 10, and its data is sent to the movement controller 82. Then, the setting of the moving speed is changed from 80 mm/s to 70 mm/s in the movement controller 82.

When the measured value N is smaller than the lower limit tolerable value B of the tolerable range, for example, a moving speed of 90 mm/s which is one level higher speed of the moving speed of the developing solution supply nozzle 70 is read according to the recipe shown in FIG. 9 and FIG. 10, and its data is sent to the movement controller 82. Then, the setting of the moving speed is changed from 80 mm/s to 90 mm/s similarly to the above-described case.

Since the supply flow rate of the developing solution corresponding to each moving speed of the developing solution supply nozzle 70 is previously determined as shown in FIG. 9, the data is sent from the main controller 92 to the flow rate controller 78 with a change in the moving speed to change the setting of the supply flow rate of the developing solution.

When the measured value N is within the tolerable range, the moving speed of the developing solution supply nozzle 70 is not changed and the present setting of the moving speed is maintained.

The moving speed of the developing solution supply nozzle 70 is changed or maintained as described above, whereby the step of correcting the moving speed is completed.

On the other hand, the development of the wafer W starts simultaneously with the developing solution being supplied onto the wafer W by the developing solution supply nozzle 70, and the wafer W is developed for a predetermined period of time.

After the completion of the development of the wafer W, the washing nozzle 71 is moved to a position above the center of the wafer W, and the wafer W is started to rotate at a predetermined speed, and the washing nozzle 71 and the rear face washing nozzles 66 supply the washing solution to wash the wafer W. Incidentally, the cup 64 is raised to receive the washing solution and the like splashing from the wafer W.

Thereafter, when the supply of the washing solution is stopped, the wafer W is rotated at a higher speed to dry. The drying step of the wafer W is completed, whereby the developing treatment for the wafer W is completed, and then the wafer W is carried out of the developing unit 18 by the main carrier unit 13.

In the above-described embodiment, the amplitude of the wave on the solution face E of the developing solution supplied onto the wafer W is measured, and when the measured value N is greater than the upper limit tolerable value A, the set value of the moving speed of the developing solution supply nozzle 70 is decreased, and when the measured value N is smaller than the lower limit tolerable value B, the set value of the moving speed is increased. This makes it possible that when the measured value, the amplitude of the wave on the solution face E of the developing solution is large, the moving speed of the developing solution supply nozzle 70 is decreased when the developing solution is supplied, thereby decreasing the amplitude of a wave on a solution face E of the developing solution supplied onto the wafer W which will be processed next. On the other hand, when the amplitude of the wave on the solution face E of the developing solution is smaller than the tolerable value, the moving speed of the developing solution supply nozzle 70 is increased, thereby reducing the difference in start time of the development within the face of the wafer W. Repeating the developing method according to the embodiment several times enables an adjustment of the moving speed of the developing solution supply nozzle 70 to an adequate moving speed, that is, a moving speed which is as high as possible and at which the amplitude of the wave on the solution face of the developing solution supplied onto the wafer W can be decreased.

Further, since the tolerable range of the amplitude of the wave of the developing solution and the recipes of a plurality of kinds of the moving speeds of the developing solution supply nozzle 70 and the supply flow rates of the developing solution in relation to the target solution film thickness of the developing solution supplied onto the wafer W, are previously stored, thereby eliminating the necessity of changing the setting of the moving speed and the like by hand each measurement, and the setting is automatically changed.

The set value of the moving speed of the developing solution supply nozzle 70 is changed when the measured value N by the laser displacement gauge 90 deviates from the tolerable range regardless of deviation from the upper limit or the lower limit in the above-described embodiment. The set value of the moving speed may, however, be changed only when the measured value N exceeds the upper limit tolerable value A of the tolerable range, in which case the amplitude of the wave of the developing solution on the wafer W can also be suppressed. Incidentally, in this case, it is suggested to make the initial setting of the moving speed of the developing solution supply nozzle 70 as high as possible in order to decrease the difference in period of development within the face of the wafer W to as small as possible.

Although the set value of the moving speed of the developing solution supply nozzle 70 is changed based on the measured value N by the laser displacement gauge 90 in the above-described embodiment, it is also suitable to change the set value of the supply flow rate of the developing solution supplied from the developing solution supply nozzle 70. Explaining such a case hereafter, the laser displacement gauge 90 measures the amplitude of the wave on the solution face E of the developing solution supplied on the wafer W, and the measured value N is compared with the previously stored tolerable range similarly to the above-described embodiment. When the measured value N is greater than the upper limit tolerable value A of the tolerable range, the set value of the supply flow rate of the developing solution is decreased, for example, according to the recipe in FIG. 9. When the measured value N is smaller than the lower limit tolerable value B of the tolerable range, the set value of the supply flow rate of the developing solution is increased.

This makes it possible that when the measured value N is excessive, that is, when the amplitude of the wave on the solution face of the developing solution supplied on the wafer W is greater than the tolerable value, the supply flow rate of the developing solution from the developing solution supply nozzle 70 when the developing solution is supplied is decreased, thereby decreasing the amplitude of the wave on the solution face E of the developing solution supplied onto the wafer W which will be processed next. On the other hand, when the measured value N is smaller than the tolerable value, the supply flow rate of the developing solution supplied onto the wafer W is increased, thereby shortening the period of time required for the developing solution to be supplied to the entire face of the wafer W, so that the adjustment is made to reduce the difference in start time of development within the face of the wafer W.

A device which measures the displacement of the object to be measured using properties of light such as laser light or the like, or one which captures the aforesaid wave as an image and measures the aforesaid amplitude from the image may be employed as the amplitude measuring device.

There are relations shown in FIG. 9 between the moving speed and the supply flow rate of the developing solution supply nozzle 70 and the film thickness of the solution. However, as the result of the experiment conducted by the inventors, when the film thickness was set at, for example, 2.0 mm, the most preferable development result without unevenness could be obtained in the case of a moving speed of 65 mm/s and a supply flow rate of 1.5 l/min. It is conceivable that if the moving speed and a supply amount of the developing solution supply nozzle 70 are not in balance, the developing solution immediately after supplied from the developing solution supply nozzle 70 flows ahead in the moving direction or is pulled toward the rear with respect to the moving direction. Further, this is also a cause for waviness.

Figure 11:
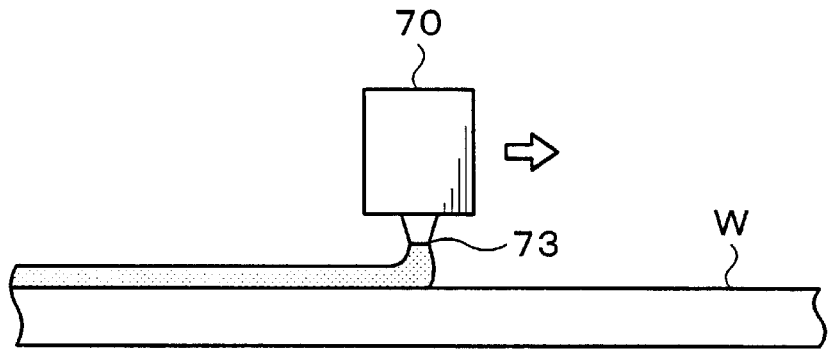
FIG. 11 is an explanatory view showing a supply state in which a moving speed of the developing solution supply nozzle and a supply amount per unit time are adequate.

Explaining this with reference to the drawings, when the relation between the moving speed and the supply amount is adequate, the developing solution immediately after supplied from the developing solution supply ports 73 of the developing solution supply nozzle 70 forms a solution film just as it is with the movement of the nozzle as shown in FIG. 11.

Figure 12:
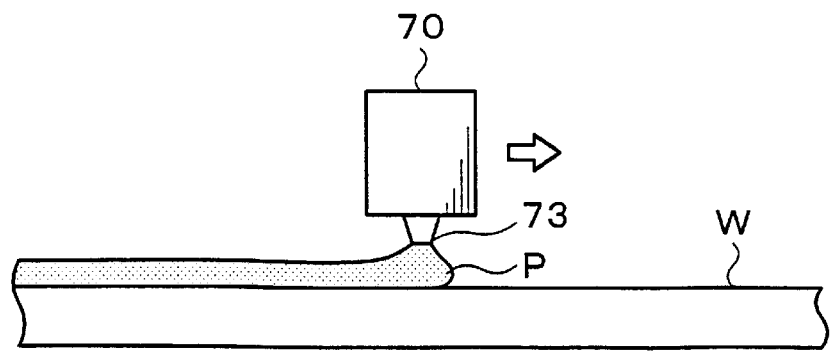
FIG. 12 is an explanatory view showing a supply state in which the moving speed of the developing solution supply nozzle is too low or the supply amount per unit time is too large.

However, when the moving speed of the developing solution supply nozzle 70 is too low, or when the supply amount per unit time is too large, the developing solution flows ahead in the moving direction of the developing solution supply nozzle 70 as shown by P in FIG. 12.

Figure 13:
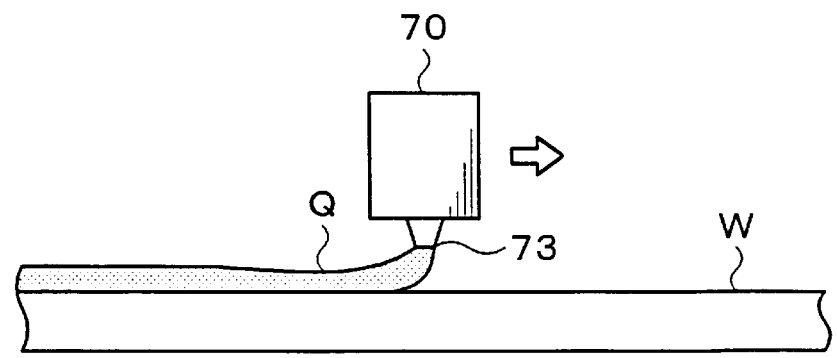
FIG. 13 is an explanatory view showing a state in which the moving speed of the developing solution supply nozzle is too high or the supply amount per unit time is too small.

Conversely, when the moving speed of the developing solution supply nozzle 70 is too high, or when the supply amount per unit time is too small, a part of the developing solution which is thinner than the solution film of the developing solution which has been previously supplied temporarily appears at a rear position with respect to the moving direction of the developing solution supply nozzle 70 as shown by Q in FIG. 13.

These phenomena are susceptible to causing waviness, resulting in occurrence of unevenness in development.

To prevent "the flowing ahead" or "the temporary occurrence of a thin solution film" as described above, it is suitable to increase the moving speed of the developing solution supply nozzle 70 or to decrease the supply amount per unit time in the case shown in FIG. 12. In the case shown in FIG. 13, conversely, it is suitable to decrease the moving speed of the developing solution supply nozzle 70 or to increase the supply amount per unit time.

As for the monitoring of "the flowing ahead" or "the temporary occurrence of a thin solution film" as described above, the former can be checked by capturing its image, for example, by a CCD camera or the like. The latter can be checked by measuring the film thickness of the solution near the rear position with respect to the moving direction of the developing solution supply nozzle 70, for example, by the laser displacement gauge.

It should be noted that the above-described embodiment is for the developing unit for the wafer W in the photolithography process in the semiconductor wafer device fabrication processes, but the present invention is applicable to a developing unit for a substrate other than the semiconductor wafer, for example, an LCD substrate.

According to the present invention, when a developing solution is supplied onto the substrate, the amplitude of a wave occurring on a solution face of the developing solution is measured, so that the amplitude of the wave of the developing solution which adversely affects upon a developing treatment can be corrected to decrease based on the measured value. Accordingly, it is unnecessary to measure a line width or the like which is finally formed on the substrate before correction as in the conventional art, and thus the correction can be made earlier as compared with the conventional case, resulting in a reduced number of defective items and improved yield.

In particular, tolerable values of the amplitude of the wave on the solution face of the developing solution are previously stored, thereby automatically changing the setting to suppress the aforesaid amplitude. Therefore, the correction is made further earlier to thereby reduce the number of defective items to improve yield.

What is claimed is:

1. A method of supplying a developing solution to an entire face of a substrate to perform a developing treatment, comprising the steps of:

moving a developing solution supply nozzle at a predetermined speed at least from one end to another end of the substrate while the developing solution is being supplied;

measuring an amplitude of a wave in a vertical direction on a solution face of the developing solution supplied on the substrate after the supply of the developing solution; and changing the predetermined speed of the developing solution supply nozzle based on the measured value.

2. A method as set forth in claim 1, further comprising the step of:

previously storing an upper limit tolerable value of the amplitude of the wave of the developing solution, wherein the predetermined speed is decreased when the measured value exceeds the upper limit tolerable value in the step of changing the predetermined speed.

3. A method as set forth in claim 1, further comprising the step of:

previously storing a tolerable range of the amplitude of the wave of the developing solution, wherein the predetermined speed is decreased when the measured value exceeds an upper limit tolerable value of the tolerable range, and the predetermined speed is increased when the measured value is below a lower limit tolerable value of the tolerable range in the step of changing the predetermined speed.

4. A method of supplying a developing solution to an entire face of a substrate to perform a developing treatment, comprising the steps of:

moving a developing solution supply nozzle at a predetermined speed at least from one end to another end of the substrate while the developing solution is being supplied;

measuring an amplitude of a wave in a vertical condition on a solution face of the developing solution supplied on the substrate after the supply of the developing solution; and changing a predetermined flow rate of the developing solution from the developing solution supply nozzle based on the measured value.

5. A method as set forth in claim 4, further comprising the step of:

previously storing an upper limit tolerable value of the amplitude of the wave of the developing solution, wherein the predetermined flow rate is decreased when the measured value exceeds the upper limit tolerable value in the step of changing the predetermined flow rate.

6. A method as set forth in claim 4, further comprising the step of:

previously storing a tolerable range of the amplitude of the wave of the developing solution, wherein the predetermined flow rate is decreased when the measured value exceeds an upper limit tolerable value of the tolerable range, and the predetermined flow rate is increased when the measured value is below a lower limit tolerable value of the tolerable range in the step of changing the predetermined flow rate.

7. A method of supplying a developing solution to an entire face of a substrate to perform a developing treatment, comprising the step of:

moving a developing solution supply nozzle at a predetermined speed at least from one end to another end of the substrate while the developing solution is being supplied, wherein the predetermined speed is increased or a supply amount from the developing solution supply nozzle is decreased when a fact that the developing solution immediately after being supplied flows ahead in a moving direction of the developing solution supply nozzle is checked by capturing an image thereof by a CCD camera during the move.

8. A method of supplying a developing solution to an entire face of a substrate to perform a developing treatment, comprising the step of:

moving a developing solution supply nozzle at a predetermined speed at least from one end to another end of the substrate while the developing solution is being supplied, wherein the predetermined speed is decreased or a supply amount from the developing solution supply nozzle is increased when a solution film thickness of the developing solution near a rear position with respect to a moving direction of the developing solution supply nozzle is measured by a laser displacement gauge so that a fact that the supplied developing solution is thinner, at a rear position with respect to a moving direction of the developing solution supply nozzle, than a part thereof which has been previously supplied during the move.

9. A developing apparatus for supplying a developing solution to an entire face of a substrate to perform a developing treatment, comprising:

a developing solution supply nozzle configured to supply the developing solution to the substrate while moving at a predetermined speed at least from one end to another end of the substrate;

an amplitude measuring device configured to measure an amplitude of a wave in a vertical direction on a solution face of the developing solution supplied on the substrate; and a moving speed controller configured to control the predetermined speed of the developing solution supply nozzle based on a value measured by the amplitude measuring device.

10. An apparatus as set forth in claim 9, further comprising:

a controller for storing a tolerable range of the amplitude of the wave of the developing solution and comparing the tolerable range and the measured value to control the moving speed controller.

11. A developing apparatus for supplying a developing solution to an entire face of a substrate to perform a developing treatment, comprising:

a developing solution supply nozzle configured to supply the developing solution to the substrate while moving at a predetermined speed at least from one end to another end of the substrate;

an amplitude measuring device configured to measure an amplitude of a wave in a vertical direction on a solution face of the developing solution supplied on the substrate; and a flow rate controller configured to control a predetermined flow rate of the developing solution from the developing solution supplu nozzle based on a value measured by the amplitude measuring device.

12. An apparatus as set forth in claim 11, further comprising:

a controller for storing a tolerable range of the amplitude of the wave of the developing solution and comparing the tolerable range and the measured value to control the flow rate controller.

13. A developing apparatus for supplying a developing solution to an entire face of a substrate to perform a developing treatment, comprising:

a developing solution supply nozzle configured to supply the developing solution to the substrate while moving at a predetermined speed at least from one end to another end of the substrate;

an amplitude measuring device configured to measure an amplitude of a wave in a vertical direction on a solution face of the developing solution supplied on the substrate; and a controller configured to control a predetermined flow rate of the developing solution from the developing solution supply nozzle and the predetermined speed of the developing solution supply nozzle based on a value measured by the amplitude measuring device.

* * * * *